(12) United States Patent
Terunuma et al.

(10) Patent No.: US 6,595,405 B2
(45) Date of Patent: Jul. 22, 2003

(54) CONNECTION STRUCTURE AND METHOD FOR CONNECTING PRINTED CIRCUIT AND METAL TERMINAL, AND REINFORCING STRUCTURE AND METHOD FOR REINFORCING JUNCTION THEREBETWEEN

(75) Inventors: Ichiro Terunuma, Sakura (JP); Kazuya Akashi, Chiba-ken (JP)

(73) Assignee: Fujikura, Ltd., Tokyo (JP)

( * ) Notice: Subject to any disclaimer, the term of this patent is extended or adjusted under 35 U.S.C. 154(b) by 40 days.

(21) Appl. No.: 09/789,587

(22) Filed: Feb. 22, 2001

(65) Prior Publication Data

US 2001/0015347 A1 Aug. 23, 2001

(30) Foreign Application Priority Data

Feb. 23, 2000 (JP) .......................... 2000-046270
Feb. 23, 2000 (JP) .......................... 2000-046271

(51) Int. Cl.[7] .......................... B23K 31/00; B23K 11/16
(52) U.S. Cl. .............................. 228/180.21; 219/56.22
(58) Field of Search .................... 228/254, 180.21, 228/110.1; 219/56, 56.1, 56.21, 56.22, 121.64

(56) References Cited

U.S. PATENT DOCUMENTS

| | | | | |
|---|---|---|---|---|
| 4,955,523 A | * | 9/1990 | Carlommagno et al. | 228/180.5 |
| 5,048,166 A | * | 9/1991 | Wakamatsu | 29/830 |
| 5,226,582 A | * | 7/1993 | Kubota et al. | 228/180.5 |
| 5,370,300 A | * | 12/1994 | Okumura | 228/180.5 |
| 5,444,188 A | * | 8/1995 | Iwayama et al. | 174/261 |
| 6,136,681 A | * | 10/2000 | Razon et al. | 438/617 |

FOREIGN PATENT DOCUMENTS

| | | | | |
|---|---|---|---|---|
| JP | 6-310224 | 11/1994 | .......... | H01R/23/66 |
| JP | 7-106014 | 4/1995 | .......... | H01R/13/52 |
| JP | 7-106016 | 4/1995 | .......... | H01R/13/56 |
| JP | 10-12328 | 1/1998 | .......... | H01R/13/68 |

* cited by examiner

Primary Examiner—Tom Dunn
Assistant Examiner—Zidia Pittman
(74) Attorney, Agent, or Firm—Sughrue Mion, PLLC

(57) ABSTRACT

A junction between the portion of wiring of an FPC, which is not covered with a cover layer, is directly connected to a connection plate tip incorporated in a terminal attachment by one of resistance welding, ultrasonic welding and laser welding.

8 Claims, 7 Drawing Sheets

CONNECTION STRUCTURE AND METHOD FOR CONNECTING PRINTED CIRCUIT AND METAL TERMINAL, AND REINFORCING STRUCTURE AND METHOD FOR REINFORCING JUNCTION THEREBETWEEN

CROSS-REFERENCE TO RELATED APPLICATIONS

This application is based upon and claims the benefit of priority from the prior Japanese Patent Applications No. 2000-046270, filed Feb. 23, 2000; and No. 2000-046271, filed Feb. 23, 2000, the entire contents of which are incorporated herein by reference.

BACKGROUND OF THE INVENTION

The present invention relates to a connection structure and method for connecting a printed circuit such as a flexible printed circuit (hereinafter referred to as an "FPC"), and a metal terminal, and also to a reinforcing structure and method for reinforcing a junction between the printed circuit and the metal terminal.

In recent years, the number of electronic components used in vehicles has increased, and hence the influence of the increase in the weight of the wire harnesses in a vehicle upon the fuel consumption is becoming serious. Therefore, to reduce the weight of the wire harness, at least part of the wire harness has come to be replaced with an FPC harness. To connect an FPC to electrical wires, in general, terminal attachments secured to the tips of the electrical wires are connected with pressure to the FPC by means of an FPC connector (see, for example, Jpn. Pat. Appln. KOKAI Publication No. 10-12328). Alternatively, piercing and soldering, etc. are used as other connection methods.

However, the method for simply connecting an FPC to terminal attachments by a connector with pressure cannot be employed in a circuit other than a low-current circuit. This is because, in the connection method, the pressure applied is low and the contact area of the FPC and the terminal attachments is small, and hence the contact resistance is inevitably high. When, for example, incorporating an FPC in a vehicle harness, there may be a case where the FPC is used as a high-current circuit of 10A or more. In this case, the FPC cannot be connected with a sufficiently low enough contact resistance to enable it to be used. Furthermore, a resin, the material of the base film of the FPC, deforms due to heat, which reduces the connection pressure over time and hence reduces the reliability of the circuit. In addition, piercing is not so reliable a method and accordingly cannot be used for a high-current circuit. In a method using solder, PET (polyethylene terephthalate) is often used as the base film of the FPC for reducing the cost. In this case, automatic soldering such as flow soldering cannot be executed in light of its heat resistance. Accordingly, the connection of the FPC to terminal attachments raises the unit price, in mass production terms.

BRIEF SUMMARY OF THE INVENTION

It is an object of the invention to provide a connection method and structure for connecting a printed circuit to metal terminals, which enables a highly reliable, high-current-bearable connection of low contact resistance.

It is another object of the invention to provide a reinforcing method and structure suitable for junctions between a printed circuit, in particular, an FPC, and metal terminals.

The invention provides a method of connecting a printed circuit having wiring formed on a printed circuit board, to a metal terminal, wherein the wiring is directly connected to the metal terminal by one of resistance welding, ultrasonic welding and laser welding.

In the invention, an excellent electrical and mechanical connection can be realized between the printed circuit board and the metal terminal by directly connecting them, using one of resistance welding, ultrasonic welding and laser welding, or by forming a low-fusion-point metal layer on at least one of their to-be-connected surfaces, and melting the low-fusion-point metal layer to connect them.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
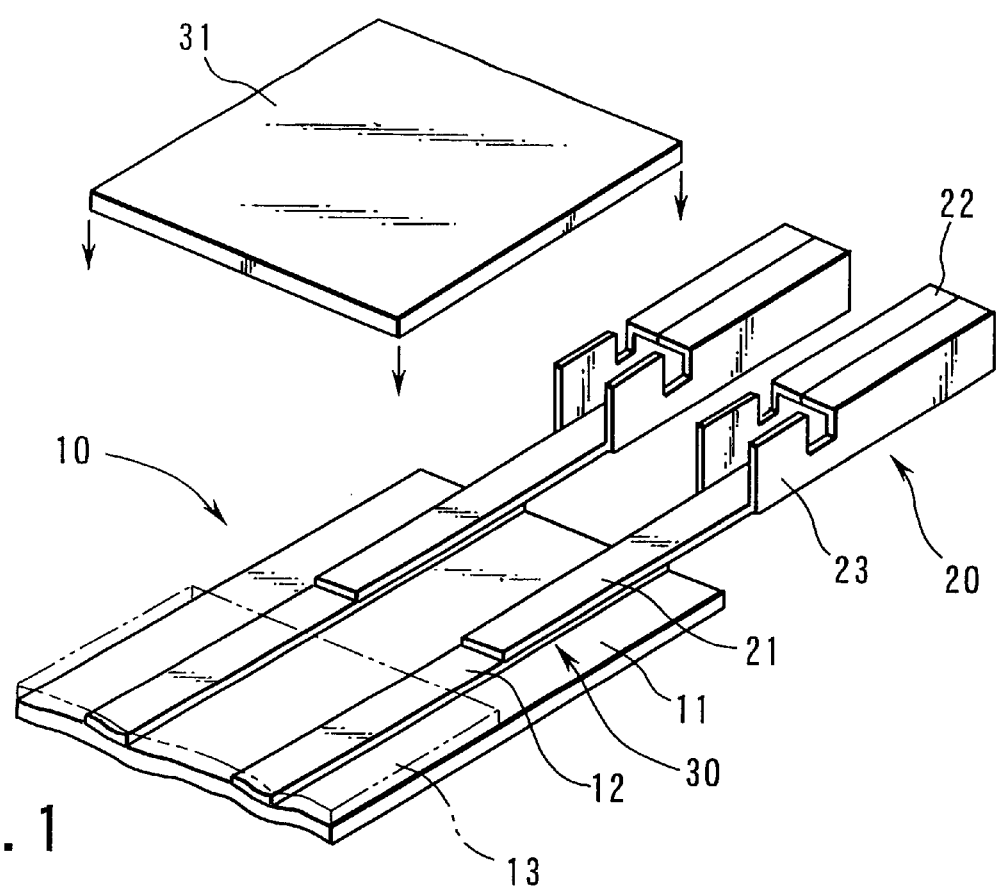
FIG. 1 is a perspective view illustrating a connection structure of an FPC and terminal attachments according to a first embodiment of the invention.

FIG. 1 shows a connection structure of an FPC 10 and terminal attachments 20 according to a first embodiment of the invention. The FPC 10 is formed by patterning wiring 12 of, for example, copper foil on a flexible resin film 11 of polyethylene terephthalate (PET) or polyethylene naphthalate (PEN), using, for example, etching. The wiring 12 other than its terminal junctions is covered with a cover layer 13. The terminal attachments 20 welded to the FPC 10 are formed by press working a metal plate, and includes a proximal-end-side connection plate tip 21, a distal-end-side rectangular receiving section 22, and an engagement tip 23 interposed therebetween and to be engaged with a connector housing (not shown). These elements are integrated as one body. In this embodiment, the wiring 12 of the FPC 10 is connected to the connection plate tip 21 of each terminal attachment 20 by direct connection. Specifically, one of ultrasonic welding, resistance welding and laser welding is used as the direct connection technique. Further, in this embodiment, a reinforcing plate 31 made of an insulator, such as a resin, is adhered to a direct junction 30 of each connection plate tip 21 and the wiring 12.

Figure 2A:
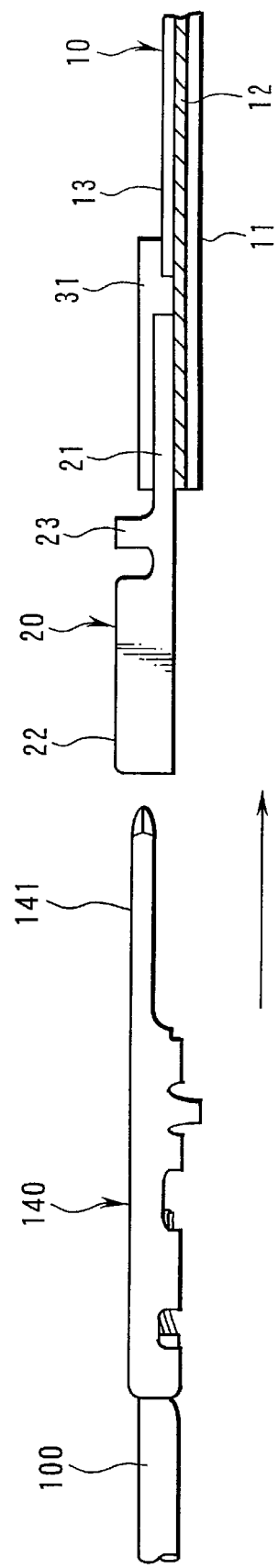
FIGS. 2A and 2B are side views useful in comparing to-be-connected terminal attachments employed in the first embodiment with the conventional ones.
Figure 2B:
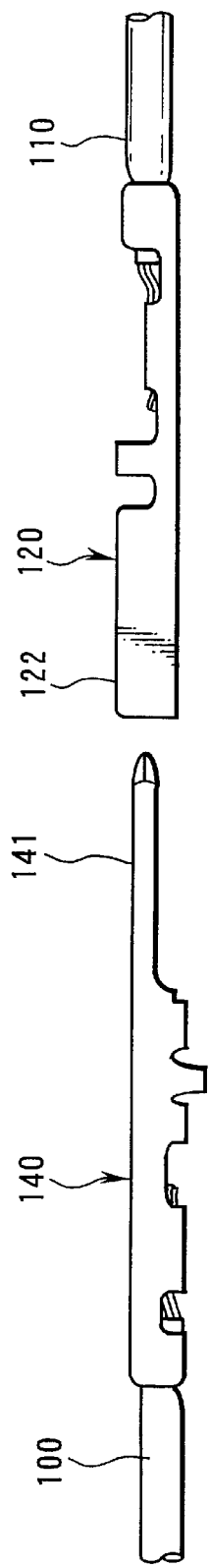

As shown in FIG. 2A, the rectangular receiving section 22 of each terminal attachment 20 is a female-type terminal attachment, which can receive a tab terminal 141 constituting a tip portion of a male-type terminal attachment 140 connected to an electrical wire 100 that is to be connected to the FPC 10. The rectangular receiving section 22, which can receive the male-type terminal attachment 140, enables the terminal attachment 20 to be used in place of a female-type terminal attachment 120, as shown in FIG. 2B, which is connected to the tip of a conventional electrical wire 110 to be connected to the male-type terminal attachment 140.

This embodiment, in which the terminal attachments are directly connected to the wiring of the FPC, unlike the conventional pressure-fastened connection, realizes a low-contact-resistance connection between the terminal attachments and the FPC, and hence is applicable to a high-current circuit, too. Moreover, the connection of the embodiment has a higher reliability than a connection by piercing. Further, the connection process of the embodiment is simpler than in the case of using soldering.

In addition, the receiving structure of each terminal attachment between the FPC and the electrical wire is basically similar to the conventional terminal attachment structure. Therefore, each terminal attachment to be connected to the FPC can employ the conventional structure, which means that the cost can be reduced when the FPC is applied to, for example, the wire harnesses of a vehicle.

Figure 3:
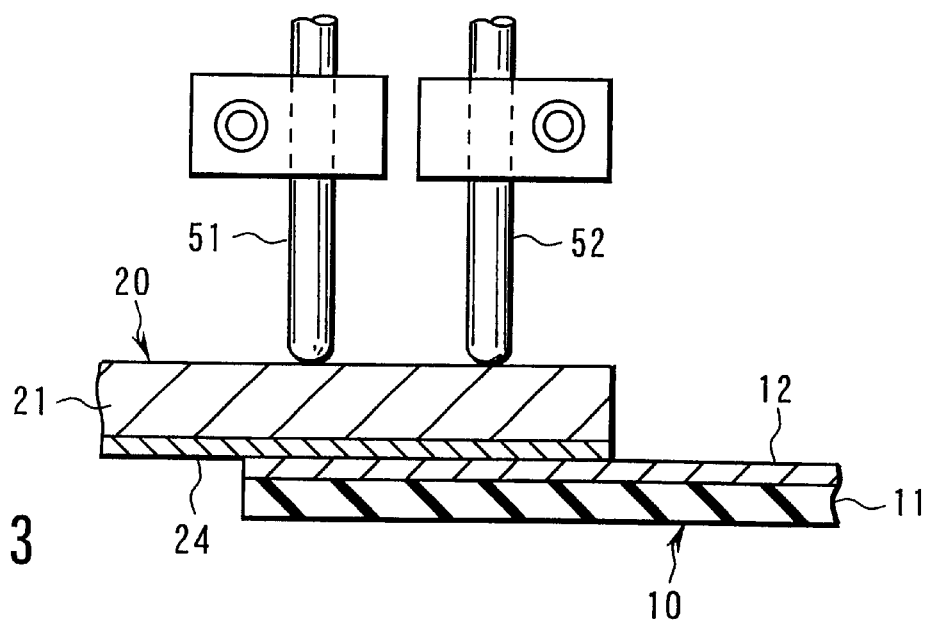
FIG. 3 is a view useful in explaining a connection method for connecting the FPC to the terminal attachments using resistance welding, employed in a second embodiment.

FIG. 3 illustrates, in more detail, a method for directly welding the connection plate tip 21 of each terminal attachment 20, constructed as above, to the wiring 12 of the FPC 10. In this embodiment, series welding is used for connecting each terminal attachments 20 to the FPC 10. The wiring 12 of the FPC 10 is made of, for example, copper foil of 35 to 70 $\mu$m thick, and preferably, about 50 $\mu$m. Each terminal attachment 20 to be connected to the FPC 10 is made of, for example, brass and has a thickness of 0.3 to 0.4 mm.

A low-fusion-point metal layer 24 is formed beforehand on at least a surface portion of each terminal attachment 20, which is to be welded to the FPC 10. It is sufficient if the low-fusion-point metal layer 24 is made of a material of a low fusion point and a low recrystallization temperature, such as a solder-plated layer or a tin-plated layer. The tin-plated layer is particularly preferable.

Thereafter, each terminal attachment 20 is mounted on the FPC 10. The two power-supply terminal electrodes 51 and 52 (e.g. tungsten or molybdenum electrodes) of a resistance-welding machine are brought into contact with those respective two points of the connection plate tip 21, which fall within an area in which each terminal attachment 20 is superposed upon the FPC 10. In this state, power is supplied to the electrodes. As a result, the low-fusion-point metal layer 24 is melted, and the melted portion serves as a material for accelerating liquid/layer diffusion welding at the boundary of the connection plate tip 21 and the wiring 12. Thus, each terminal attachment 20 and the FPC 10 are directly and strongly adhered to each other.

In this embodiment, the low-fusion-point metal layer 24 is melted where the supplied current is relatively low and hence the heat of resistance is also relatively small, thereby accelerating a reaction between the connection plate tip 21 and the wiring 12. Further, the heat generated by the resistance of the connection plate tip 21 is effectively transmitted to the wiring 12 via the melted portion of the low-fusion-point metal layer 24. Tungsten or molybdenum constituting the power supply terminal electrodes 51 and 52 and having a high resistance generates a lot of heat, which is also effectively transmitted to each terminal attachment 20. This enables a direct connection between each terminal attachment 20 and the FPC 10 without using a large amount of current as in the conventional case, and also facilitates the setting of conditions for realizing a direct connection without, for example, breaking the wiring 12.

Figure 4:
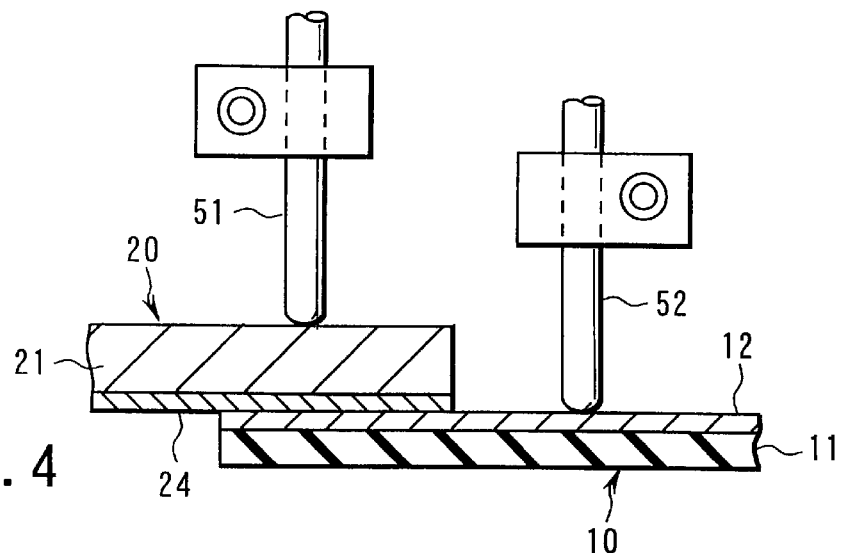
FIG. 4 is a view useful in explaining a connection method for connecting the FPC to the terminal attachments using resistance welding, employed in a third embodiment.

The above-described embodiments concern series welding. FIG. 4 illustrates a third embodiment that uses indirect welding. Also in this case, a low-fusion-point metal layer 24 is formed beforehand on at least a surface portion of each terminal attachment 20, which is to be welded to the FPC 10. The power supply terminal electrode 51 is brought into contact with the connection plate tip 21 in an area in which each terminal attachment 20 is superposed upon the FPC 10, while the other electrode 52 is brought into contact with the wiring 12 of the FPC 10. In this state, power is supplied.

The third embodiment can also realize a direct connection between the metal terminal and the FPC, which shows a low-contact-resistance and a sufficient mechanical strength, for the same reason as in the embodiment of FIG. 3.

Figure 5:
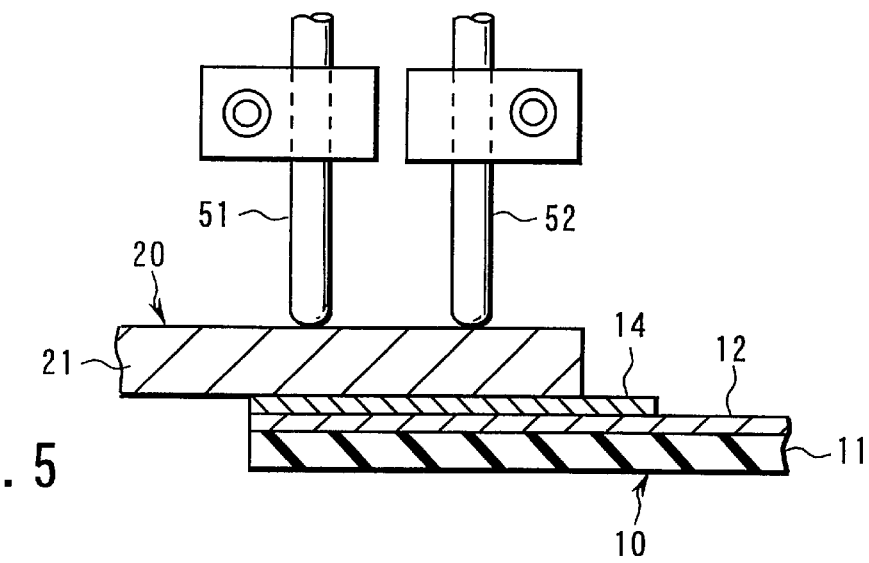
FIG. 5 is a view useful in explaining a connection method for connecting the FPC to the terminal attachments using resistance welding, employed in a modification of the second embodiment.

FIG. 5 illustrates a modification of the embodiment of FIG. 3. In this modification, a low-fusion-point layer 14 is provided beforehand not on each terminal attachment 20 but on the wiring 12 of the FPC 10. The other structures are similar to those of FIG. 3.

Figure 6:
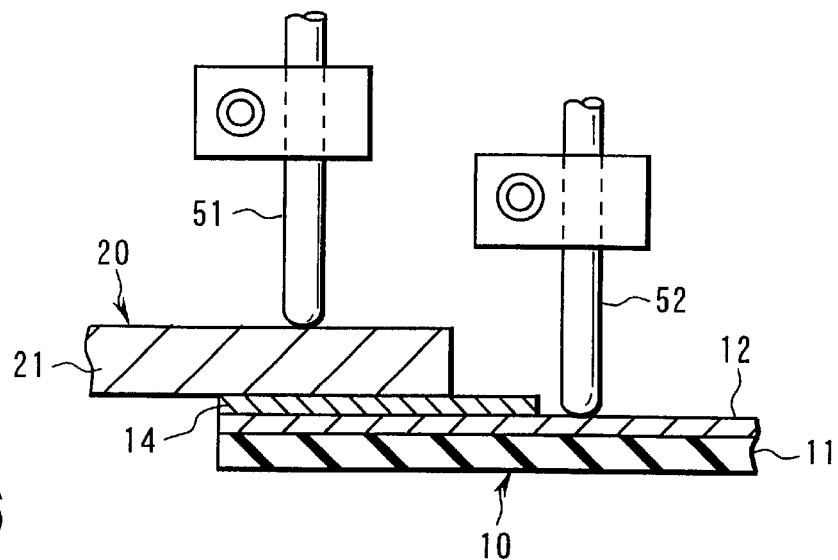
FIG. 6 is a view useful in explaining a connection method for connecting the FPC to the terminal attachments using resistance welding, employed in a modification of the third embodiment.

FIG. 6 illustrates a modification of the embodiment of FIG. 4. Also in this modification, a low-fusion-point layer 14 is provided beforehand not on each terminal attachment 20 but on the wiring 12 of the FPC 10. The other structures are similar to those of FIG. 4.

These modifications can also realize a direct connection between the metal terminal and the FPC, which shows a low contact resistance and a sufficient mechanical strength.

Figure 7:
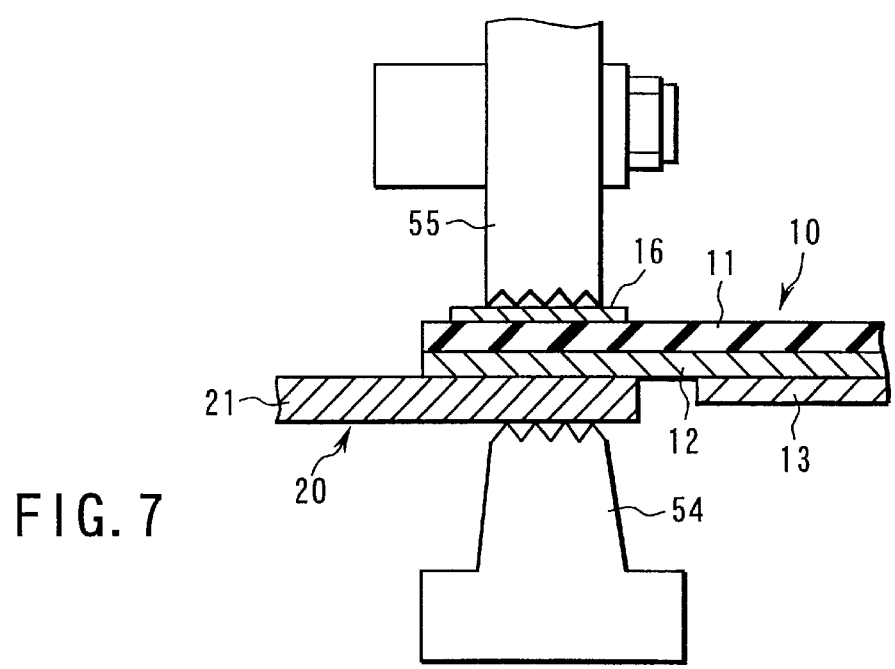
FIG. 7 is a view illustrating a connection method for connecting the FPC to the terminal attachments using ultrasonic welding, employed in a fourth embodiment.

FIG. 7 shows a fourth embodiment of the invention. In this embodiment, each terminal attachment 20 is welded to the FPC 10 by ultrasonic welding. The connection plate tip 21 of each terminal attachment 20 and the wiring 12 of the FPC 10 are made to overlap each other via the tip 21, and are held between the anvil 54 and the horn 55 of an ultrasonic welding machine. Further, in this case, the horn 55 does not directly touch the resin film 11, but a metal foil 16 is interposed therebetween. It is sufficient if the metal foil 16 is formed of a metal other than a metal, such as tin or zinc, which has a recrystallization temperature lower than room temperature. For example, copper or aluminum foil of several dozen μm thick may be used as the metal foil 16.

Also in this embodiment, a direct connection showing a low contact resistance and a sufficient mechanical strength can be realized between the metal terminal and the FPC. In addition, in this case, the horn 55 does not directly touch the FPC 10. Ultrasonic vibration is transmitted from the horn 55 to a structure of the metal foil 16, the resin film 11 and the wiring 12 layered in this order. Accordingly, ultrasonic energy is efficiently transmitted to the wiring 12 without being greatly absorbed by the resin film 11. As a result, the FPC 10 can be reliably connected to each terminal attachment 20. Furthermore, since in this method, the metal foil 16 is interposed between the horn 55 and the resin film 11, and welding can be executed in a short time, the resin film 11 is prevented from being melted by the heat of friction, and thus adherence to the horn 55 is prevented. Thus, the horn 55 is maintained in a good condition.

Figure 8:
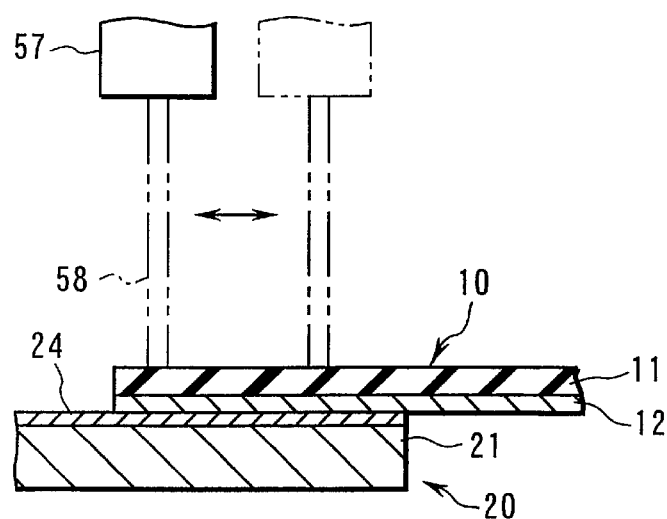
FIG. 8 is a view illustrating a connection method for connecting the FPC to the terminal attachments using laser welding, employed in a fifth embodiment.

FIG. 8 shows a fifth embodiment of the invention. In this embodiment, laser welding is used for connecting each terminal attachment 20 to the FPC 10. The connection plate tip 21 of the terminal attachment 20 and the wiring 12 of the FPC 10 are made to overlap each other via the low-fusion-point metal layer 24 provided on the tip 21. Then, a laser beam 58 is emitted from a laser-welding machine 57 to that backside portion of the resin film 11 of the FPC 10, which is in an area in which each terminal attachment 20 overlaps the FPC 10. This method also enables a direct connection of the FPC and the metal terminal, which shows a low contact resistance and a sufficient mechanical strength.

Figure 9:
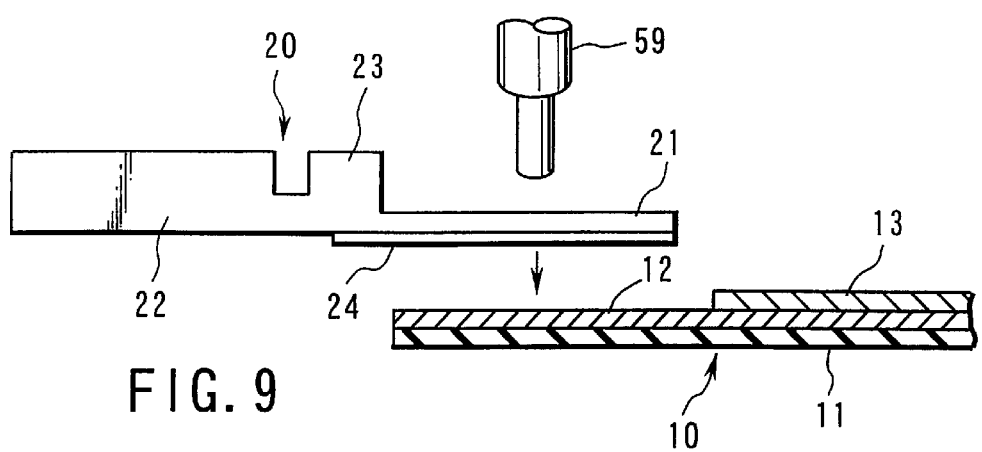
FIG. 9 is a view illustrating a connection method for connecting the FPC to the terminal attachments using wax, employed in a sixth embodiment.

FIG. 9 illustrates another connection method for connecting the FPC 10 to each terminal attachment 20, employed in a sixth embodiment. Each terminal attachment 20 and the FPC 10 employed in this embodiment are similar to those used in the previous embodiments. Therefore, elements of each attachment 20 and the FPC 10 corresponding to those in the previous embodiments are denoted by corresponding reference numerals. Also in this embodiment, the low-fusion-point metal layer 24 is previously formed on that surface of the connection plate tip 21 of each terminal attachment 20, which is to be connected to the FPC 10. Each terminal attachment 20 and the FPC 10 are made to overlap each other, and a soldering pallet 59 is brought into contact with the connection plate tip 21, thereby melting the low-fusion-point layer 24 and soldering the tip 21 to the wiring 12 of the FPC 10.

This embodiment can also realize a lower-resistance connection of the FPC and the terminal attachment than in the case of a pressure-fastened connection. Moreover, as a result of soldering, the mechanical strength of a junction of the FPC and each terminal attachment is increased. In addition, when using a PET film, automatic soldering such as flow soldering or reflow soldering cannot be executed. In this embodiment, however, automatic soldering can be realized since it is sufficient if the solder pallet is brought into contact with the terminal attachment.

Figure 10:
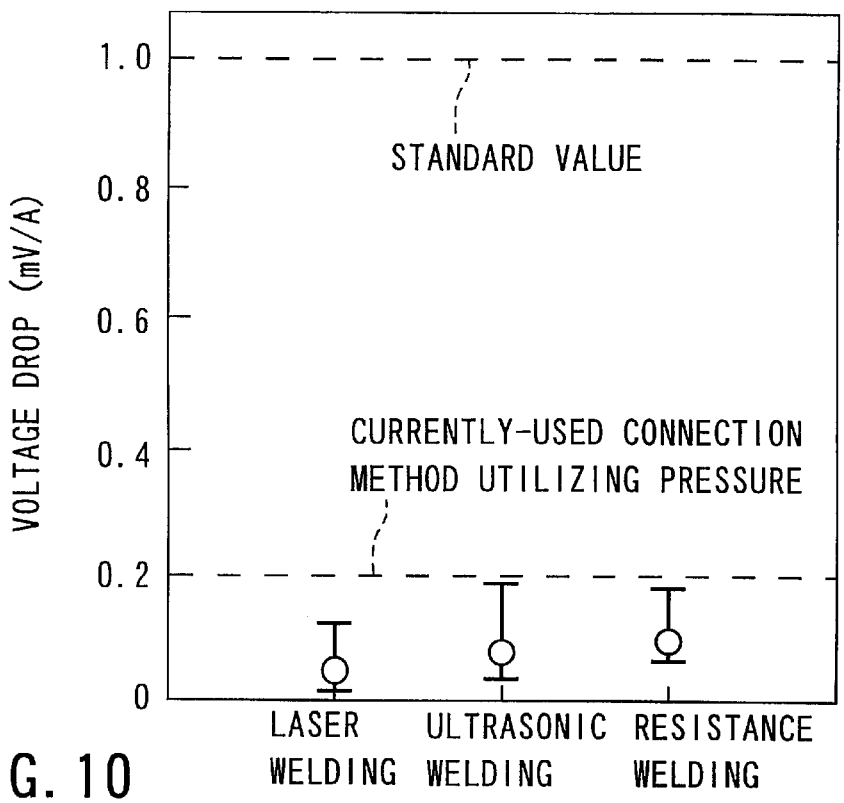
FIG. 10 is a view illustrating the results of voltage drop tests executed using the connection methods employed in the above-mentioned embodiments.
Figure 11:
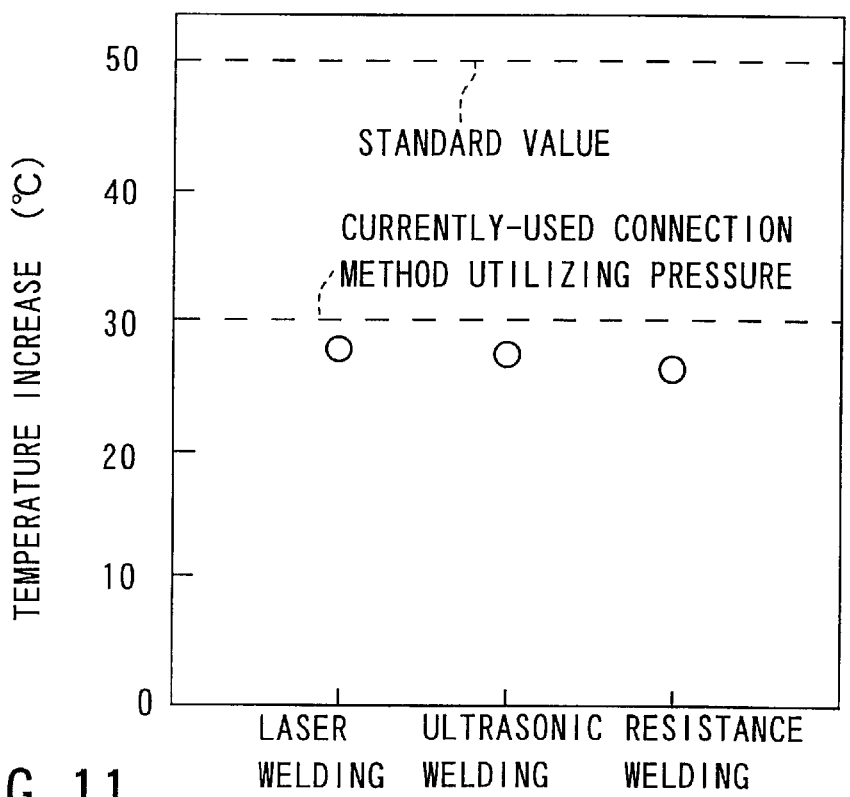
FIG. 11 is a view illustrating the results of temperature increase tests executed using the connection methods employed in the above-mentioned embodiment.

FIGS. 10 and 11 show the results of estimation tests executed on those junctions of the FPC and the terminal attachment, which are obtained in the above-described embodiments. Specifically, FIG. 10 shows results of voltage drop tests, indicating a standard voltage drop, a voltage drop occurring in the currently-available pressure-fastened connector, and voltage drops (the average value and variations) occurring at the junctions of the embodiments. FIG. 11 shows temperature increases (average values) in the junctions of the embodiments obtained when a current of 10A is flown therethrough, as compared to a standard temperature increase and a temperature increase in the currently-available pressure-fastened connector.

As is evident from the results, the voltage drops and the temperature increases at the junctions of the embodiments are both lower than those in the currently-available pressure-fastened connector. This means that the junctions of the embodiments have higher electrical properties than the currently-available pressure-fastened connector.

Figure 12:
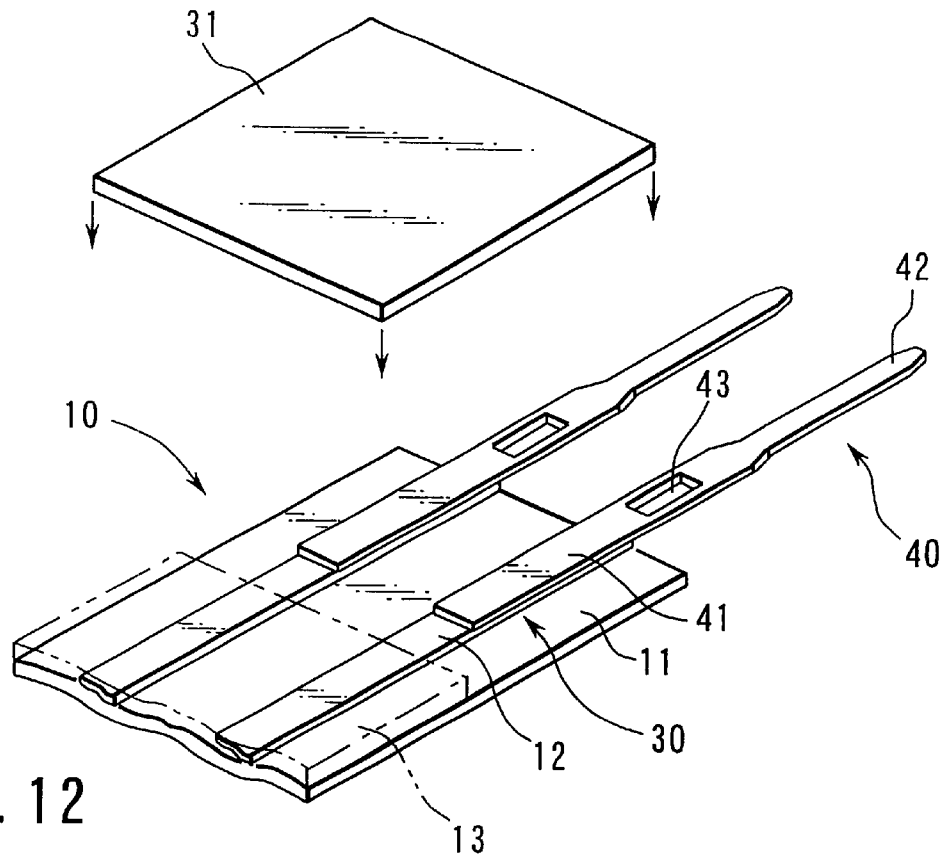
FIG. 12 is a perspective view illustrating a connection structure of an FPC and terminal attachments according to a seventh embodiment of the invention.

FIG. 12 shows a structure in which male-type terminal attachments 40 are connected to the FPC 10 in place of the female-type terminal attachments 20 shown in FIG. 1. Each terminal attachment 40 is formed by press-working a metal plate. It includes a proximal-end-side connection plate tip 41, and a distal-end-side tab terminal 42 to be engaged with the rectangular receiving section 22 of the female-type terminal attachment 20. The elements 41 and 42 are integrated as one body. A hole 43 to be engaged with an engagement tip of a connector housing (not shown) is formed in a middle portion of each terminal attachment 40. The other structures and the connection method used are similar to those in the previous embodiments.

In the embodiment of FIG. 1, the female-type terminal attachment 20 can be used in place of the conventional female-type terminal attachment 120, as is shown in FIG. 2. On the other hand, in this embodiment, the male-type terminal attachment 40 can be connected to the conventional female-type terminal attachment 120 in place of the conventional male-type terminal attachment 140 shown in FIG. 2.

Figure 13:
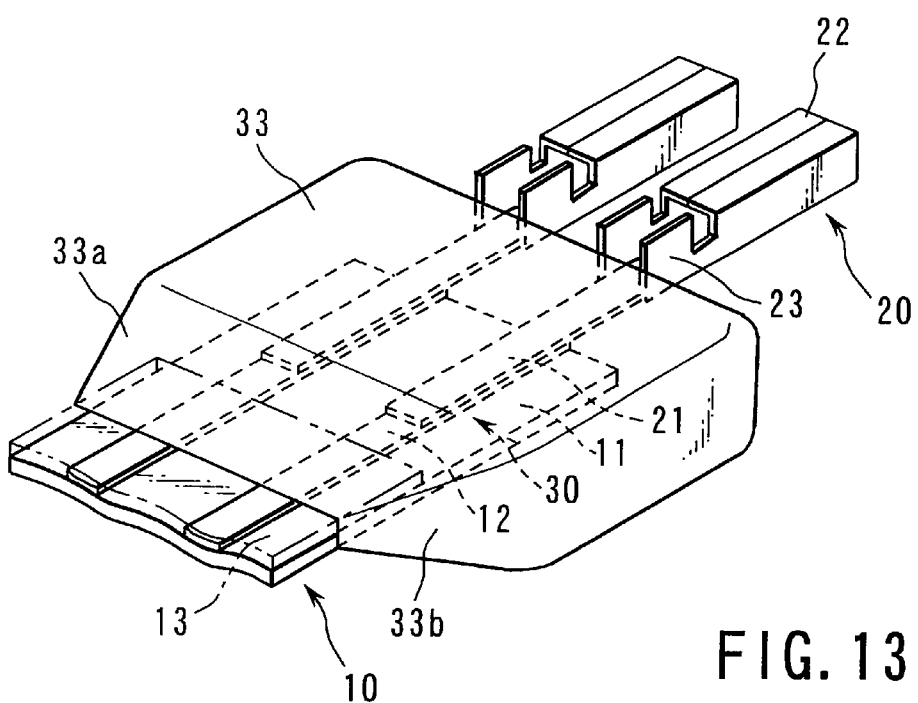
FIG. 13 is a perspective view illustrating a reinforcing structure of junctions between an FPC and terminal attachments according to an eighth embodiment of the invention.

FIG. 13 shows other examples of reinforced junctions 30 of the FPC and the metal terminals, constructed as above. In this case, a resin mold section 33 made of, for example, a polyamide-based hot melt resin is provided around the junctions 30 to cover them. The resin mold section 33 has tapered surfaces 33a and 33b, which have their respective widths and thicknesses gradually reduced toward an end of the section 33 remote from the rectangular sections 20.

Figure 14:
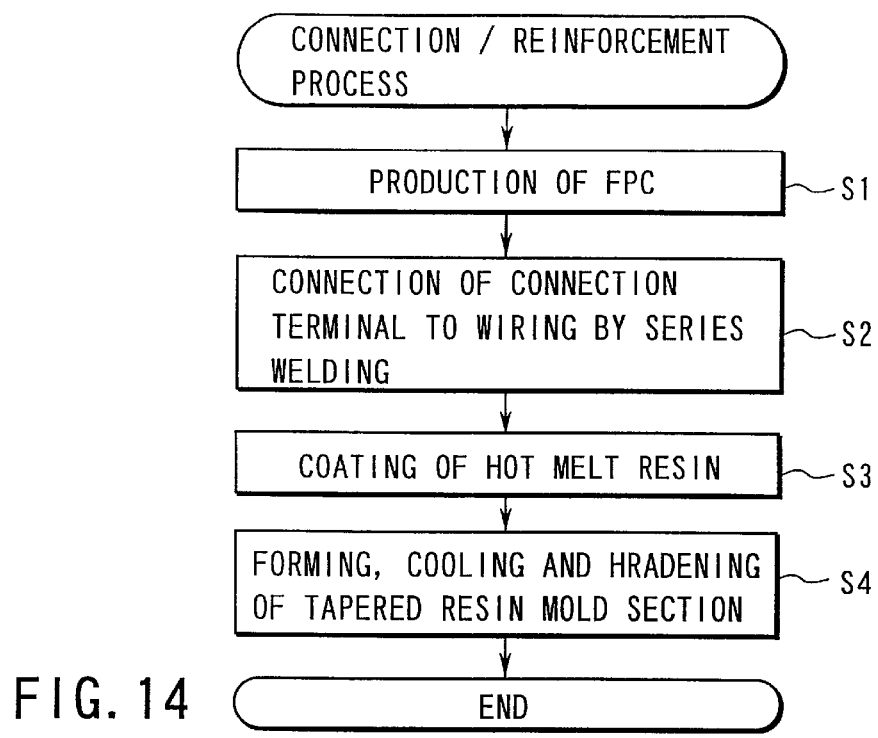
FIG. 14 is a flowchart useful in explaining the process of connecting the FPC to the terminal attachments and reinforcing the junctions therebetween, executed in the embodiment of FIG. 13.

FIG. 14 is a flowchart useful in explaining the process of welding the terminal attachments 20 to the FPC 10 and reinforcing their junctions. In the process, at first, a sheet coated with copper foil and having a desired pattern, for example, is formed on the insulating film 11 that is made of PET or PEN and serves as the base of the FPC 10. Subsequently, wiring 12 of a certain pattern is provided on the upper surface of the insulating film 11 by, for example, etching. After that, the cover layer 13 is formed on those portions of the insulating film 11 and the wiring 12, which are not to be formed into terminal sections, thereby producing the FPC 10 (step S1). Thereafter, the connection plate tips 21 of the terminal attachments 20 are placed on the wiring 12 exposed on the terminal section of the produced FPC 10. The electrodes of, for example, a series welding machine are brought into contact with the connection plate tips 21, thereby supplying power to the tips, welding the tips 21 to the wiring 12 and forming junctions 30 (step S2). After forming the junctions 30, a portion of the FPC around the junctions 30 is coated with a hot melt resin (step S3), thereby forming a proximal end portion of the coated hot melt resin into a portion having tapered surfaces 33a and 33b, in which the thickness of the hot melt resin gradually reduces from the terminal attachment 20 side to the FPC 10 side, and cooling and hardening the tapered surfaces (step S4). Thus, the resin mold section 33 that covers the junctions 30 is formed (step S5).

Figure 15A:
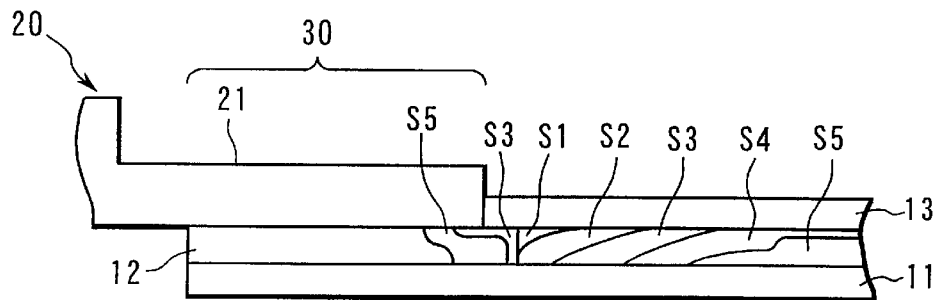
FIGS. 15A and 15B are schematic views useful in explaining the results of stress analysis of the junctions in the embodiment of FIG. 13.
Figure 15B:
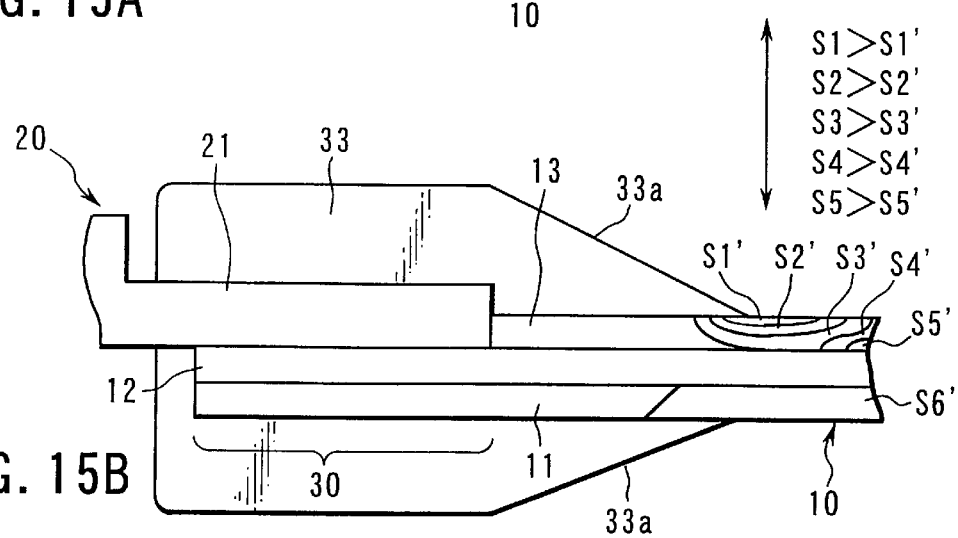

FIGS. 15A and 15B illustrate the results of the FEM (Finite Element Method) analysis concerning a load applied to a peripheral portion of the junctions 30 in the direction of bending. This analysis was executed in both the case where the resin mold section 33 is provided (FIG. 15A), and the case where it is not provided (FIG. 15B). As shown in FIG. 15A, where no resin mold section 33 is provided, stress is concentrated on a proximal end of a junction 30 between the connection plate tip 21 of each terminal attachment 20 and the wiring 12 of the FPC 10. On the other hand, as shown in FIG. 15B, where the resin mold section 33 is provided to cover the junction 30, no stress is concentrated on the proximal end of the junction 30. Further, the tapered proximal end portion of the resin mold section 33 also reduces the concentration of stress on that portion of the FPC 10, which corresponds to the proximal end portion of the resin mold section 33. Accordingly, there is almost no possibility of damaging the FPC 10.

As described above, in the invention, the connection plate tip 21 of the terminal attachments 20 are welded to the wiring 12 of the FPC 10 by, for example, series welding, thereby forming the junctions 30. To reinforce the mechanical strength of the junctions 30, a hot melt resin, for example, is coated on the resultant structure so as to cover the junctions 30, thereby forming the resin mold section 33 with a tapered proximal end portion that has its thickness gradually reduced from the terminal attachment 20 side to the FPC 10 side. This structure increases the mechanical strength of the junctions 30 against the force applied thereto to peel them from the FPC 10, thereby preventing the connection plate tips 21 from being separated from the wiring 12. Further, since the resin mold section 33 is formed by, for example, coating a hot melt resin, the cost required for reinforcing the junctions can be reduced. Moreover, tapering the resin mold section 33 from the terminal attachment 20 side to the FPC 10 side enables deconcentration of stress applied to the FPC 10 at a proximal end of the resin mold section 33, thereby preventing the FPC 10 from, for example, being damaged.

The hot melt resin that forms the resin mold section 33 may be a polyurethane-based resin, a polyolefin-based resin or a polyester-based resin, as well as the aforementioned polyamide-based resin. This kind of hot melt resin enables a low-cost reinforcement of the junctions 30.

Although the above-described embodiments are cases of using the FPC, the invention is not limited to them but is also applicable to the case of connecting a metal terminal such as a terminal attachment to a printed circuit board other than the FPC.

Furthermore, although, in the above-described embodiments, the low-fusion-point metal layer is formed on either the terminal attachment or the wiring, it is preferable to form the metal layer on both of them, in order to secure the reliability of the structure.

In addition, the invention is applicable to a method for connecting FPCs, as well as a connection terminal for connecting an FPC to an electrical wire.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of connecting a printed circuit having wiring formed on a printed circuit board, to a metal terminal, wherein the wiring is directly connected to the metal terminal by resistance welding to melt a low-fusion-point metal layer, and wherein two power supply terminal electrodes are used for the resistance welding, the two power supply terminal electrodes being brought, during the resistance welding, into contact with those two portions of the metal terminal, which are separated by a predetermined distance and fall within an area in which the metal terminal overlaps the printed circuit.

2. The method according to claim 1, wherein the power supply terminal electrodes are tungsten electrodes or molybdenum electrodes.

3. A method of connecting a printed circuit having wiring formed on a printed circuit board, to a metal terminal, wherein the wiring is directly connected to the metal terminal by resistance welding, and, wherein two power supply terminal electrodes are used for the resistance welding, the two power supply terminal electrodes being brought, during the resistance welding, into contact with those two portions of the metal terminal, which are separated by a predetermined distance and fall within an area in which the metal terminal overlaps the printed circuit.

4. The method according to claim 3, wherein the power supply terminal electrodes are tungsten electrodes or molybdenum electrodes.

5. A method of connecting a printed circuit having wiring formed on a printed circuit board, to a metal terminal, wherein the wiring is directly connected to the metal terminal by resistance welding to melt a low fusion-point-metal layer, and wherein two power supply terminal electrodes separated by a predetermined distance are used for resistance welding, one of the two power supply terminal electrodes being brought, during the resistance welding, into contact with that portion of the metal terminal, which falls within an area in which the metal terminal overlaps the printed circuit, and the other of the two power supply terminal electrodes being brought, during the resistance welding, into contact with the wiring of the printed circuit.

6. The method according to claim 5, wherein the power supply terminal electrodes are tungsten electrodes or molybdenum electrodes.

7. A method of connecting a printed circuit having wiring formed on a printed circuit board, to a metal terminal, wherein the wiring is directly connected to the metal terminal by resistance welding, and wherein two power supply terminal electrodes separated by a predetermined distance are used for resistance welding, one of the two power supply terminal electrodes being brought, during the resistance welding, into contact with that portion of the metal terminal, which falls within an area in which the metal terminal overlaps the printed circuit, and the other of the two power supply terminal electrodes being brought, during the resistance welding, into the wiring of the printed circuit.

8. The method according to claim 7, wherein the power supply terminal electrodes are tungsten electrodes or molybdenum electrodes.

* * * * *